(12) United States Patent
Lai et al.

(10) Patent No.: US 12,342,541 B2
(45) Date of Patent: Jun. 24, 2025

(54) MEMORY DEVICE AND METHOD FOR FORMING THE SAME

(71) Applicant: MACRONIX INTERNATIONAL CO., LTD., Hsinchu (TW)

(72) Inventors: Erh-Kun Lai, Taichung (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 605 days.

(21) Appl. No.: 17/731,304

(22) Filed: Apr. 28, 2022

(65) Prior Publication Data

US 2023/0354602 A1    Nov. 2, 2023

(51) Int. Cl.
*H10B 43/27* (2023.01)
*H01L 23/535* (2006.01)
*H10B 41/27* (2023.01)

(52) U.S. Cl.
CPC ............ *H10B 43/27* (2023.02); *H01L 23/535* (2013.01); *H10B 41/27* (2023.02)

(58) Field of Classification Search
CPC ........ H10B 43/27; H10B 43/40; H10B 41/27; H01L 23/535
See application file for complete search history.

(56) References Cited

U.S. PATENT DOCUMENTS

| 10,446,437 | B2 | 10/2019 | Yang | |
| 2019/0214395 | A1 | 7/2019 | Zhang | |
| 2020/0286911 | A1 | 9/2020 | Hua | |
| 2020/0328223 | A1* | 10/2020 | Lai | H10B 43/27 |
| 2021/0005621 | A1 | 1/2021 | Hu | |
| 2023/0075993 | A1* | 3/2023 | Sakata | H01L 25/18 |

FOREIGN PATENT DOCUMENTS

TW    I622132 B    4/2018

* cited by examiner

*Primary Examiner* — Sitaramarao S Yechuri
(74) *Attorney, Agent, or Firm* — McClure, Qualey & Rodack, LLP

(57) ABSTRACT

An integrated circuit structure includes a substrate, an interconnect stack, a first memory array, and a source line. The interconnect stack is over the substrate. The first memory array is over the interconnect stack and includes memory elements stacked in a vertical direction each comprising a conductive layer. The first memory array further includes a memory layer electrically connecting to the conductive layers of the memory elements and extending downwardly from a topmost one of the conductive layers to a lowermost one of the conductive layers; and a channel layer extending along a sidewall of the memory layer. The source line is in contact with a top end of the channel layer and laterally extends across the first memory array.

20 Claims, 21 Drawing Sheets

MEMORY DEVICE AND METHOD FOR FORMING THE SAME

BACKGROUND

Field of Invention

The present invention relates to a memory device. More particularly, the present invention relates to a method for forming a memory device.

Description of Related Art

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

The invention provides an integrated circuit (IC) structure includes a substrate, an interconnect stack, a first memory array, and a source line. The interconnect stack is over the substrate. The first memory array is over the interconnect stack and includes first memory elements stacked in a vertical direction each including a conductive layer. The first memory array further includes a memory layer electrically connecting to the conductive layers of the first memory elements and extending downwardly from a topmost one of the conductive layers to a lowermost one of the conductive layers; and a channel layer extending along a sidewall of the memory layer. The source line is in contact with a top end of the channel layer and laterally extends across the first memory array.

In some embodiments, the IC structure further includes a second memory array over the interconnect stack and including a plurality of second memory elements stacked in the vertical direction, the source line further laterally extending across the second memory array.

In some embodiments, the IC structure further includes a metal plug laterally between the first and second memory arrays and downwardly extending from the source line to the interconnect stack.

In some embodiments, the IC structure further includes a dielectric material laterally between the first and second memory arrays and extending through the conductive layers.

In some embodiments, when viewed in a cross section, the dielectric material has a longitudinal end in a position vertically between the source line and a topmost one of the conductive layers of the first memory array.

In some embodiments, the IC structure further includes an air gap in the dielectric material. a through via downwardly extending past the source line and the first memory array into the interconnect stack to provide an electrically connection between the source line and in the substrate.

In some embodiments, the IC structure further includes a through via downwardly extending past the source line and the first memory array into the interconnect stack to provide an electrically connection between the source line and in the substrate.

In some embodiments, the first memory elements are NAND memory elements.

In some embodiments, the interconnect stack includes a first interconnect structure and a second interconnect structure. The first interconnect structure is over the substrate and includes a first bonding layer. The second interconnect structure is sandwiched between the first interconnect structure and the first memory array and includes a second bonding layer bonded to the first bonding layer of the first interconnect structure.

In some embodiments, the IC structure further includes a metal layer formed on a top surface of the source line.

The invention provides a method for forming a memory device. The method includes forming a memory array including a plurality of memory elements stacked in a vertical direction on a front side surface of a first substrate; forming a first interconnect structure on the memory array; bonding the first interconnect structure to a second interconnect structure on a second substrate; performing a planarization process on a back side surface of the first substrate to expose a channel layer in the memory array; forming a source line on the exposed channel layer.

In some embodiments, the planarization process is performed until an outermost one of insulating layers in the memory array is exposed.

In some embodiments, the method further includes forming a through via extending from a side of the memory array away from the first substrate to past the first interconnect structure, the through via having a longitudinal end in the second interconnect structure.

In some embodiments, the memory elements are NAND memory elements.

In some embodiments, the method further includes forming a silicide layer on the source line.

In some embodiments, the method further includes forming a multi-layered stack including insulating layers and sacrificial layers alternately stacked in the vertical direction on the front side surface of the first substrate; etching the multi-layered stack to form a first through opening exposing the first substrate; forming a memory layer, the channel layer, and a first dielectric material in the first through opening; etching the multi-layered stack to form a second through opening; replacing the sacrificial layers with conductive layers through the second through opening to form the memory array.

In some embodiments, etching the multi-layered stack to form the first through opening includes further etching the first substrate such that a bottom of the first through opening is in the first substrate.

In some embodiments, the step of etching the multi-layered stack to form the second through opening terminates prior to reaching the first substrate.

In some embodiments, forming the first dielectric material is performed such that an air gap is in the first dielectric material in the first through opening.

In some embodiments, the method further includes filling the second through opening with a second dielectric material.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
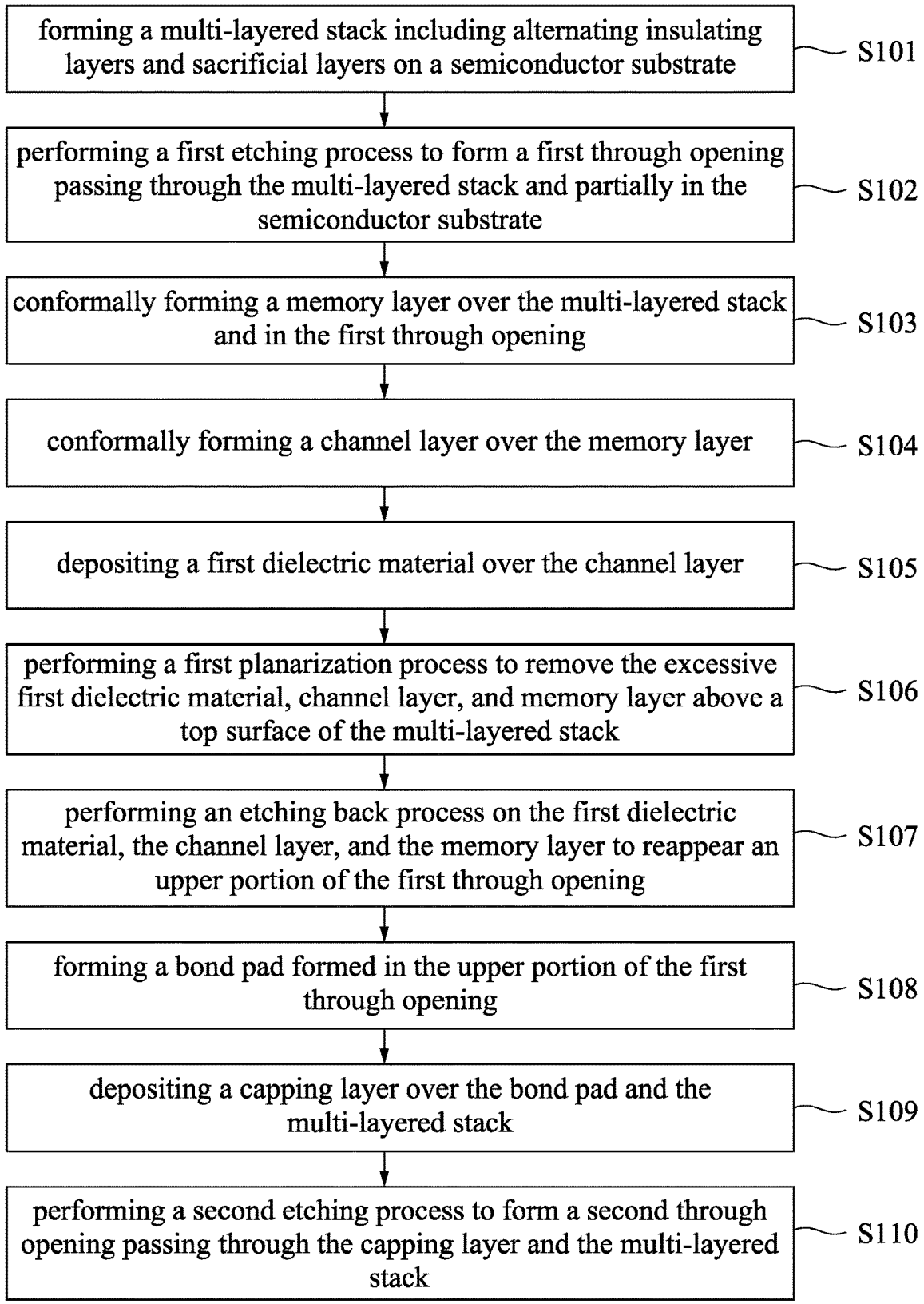
FIGS. 1A and 1B are a flowchart of a method for forming a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

For next generation semiconductor devices, it is desirable to include memories that can provide high density storage. Therefore, a 3-dimensional (3D) integrated circuit (IC) memory device, such as 3D NAND, can provide high density storage by its multi-layered structure. However, the more layers in 3D NAND are stacked, the harder it is for the source line underneath to form, which may result in low yield. Therefore, the present disclosure in various embodiments provides a 3D NAND having a source line formed thereabove by using a top surface process, which in turn allows the source line to be formed more easily and further improves yield and reduces manufacturing complexity. Moreover, once the source line is formed, the 3D NAND with a carrier wafer can be bonded to a CMOS wafer to electrically connect semiconductor devices in the CMOS wafer. Therefore, before the bonding, the 3D NAND can be formed in a high thermal budget process without impacting the CMOS wafer, which in turn allows for improving the performance of the semiconductor devices in the CMOS wafer.

Figure 1B:
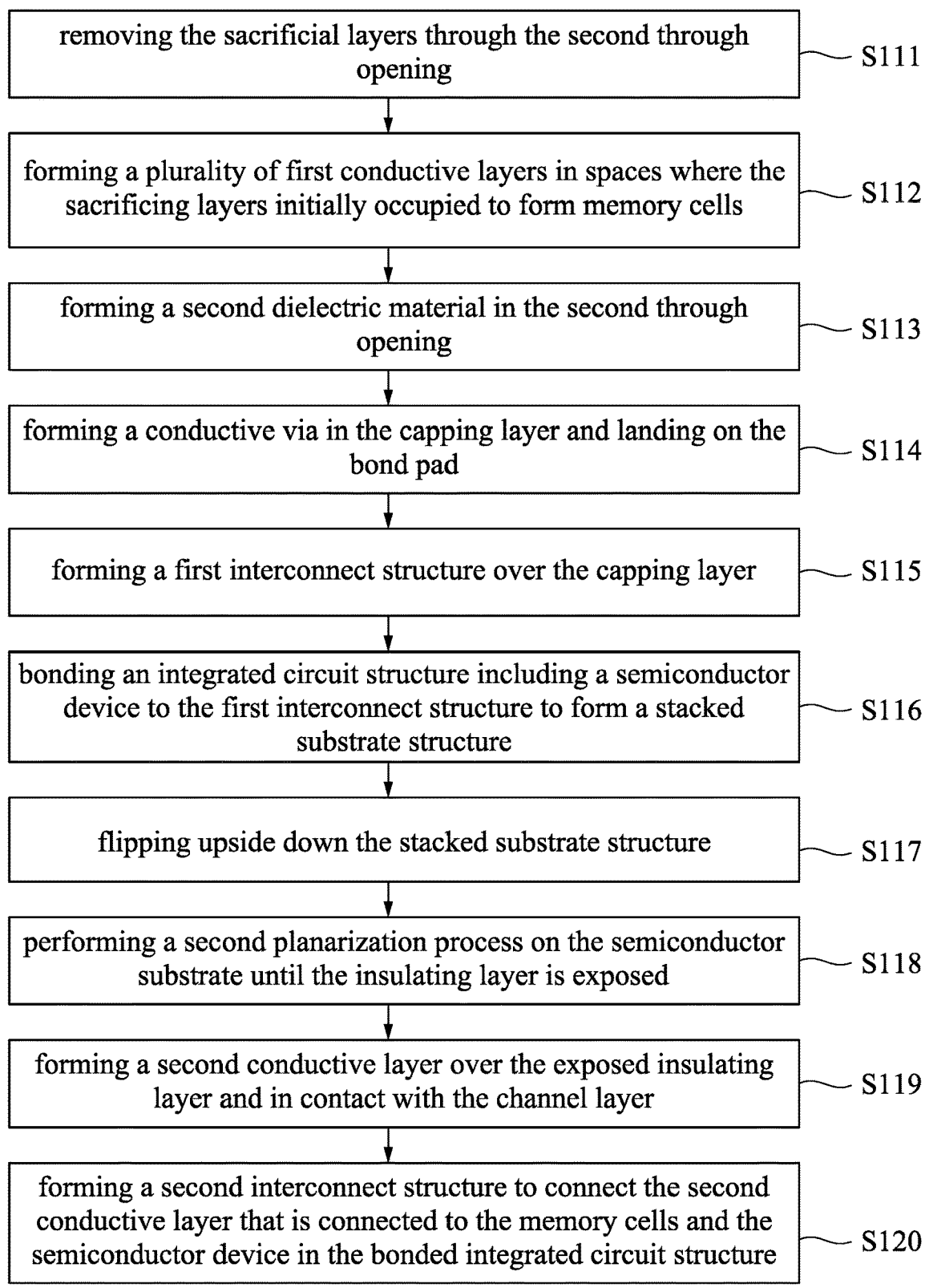

Referring now to FIGS. 1A and 1B, illustrated is a flowchart of an exemplary method M for fabrication of a memory device in accordance with some embodiments. The method M includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M includes fabrication of a memory device (e.g., NAND memory devices). However, the fabrication of the memory device is merely an example for describing the manufacturing process according to some embodiments of the present disclosure.

Figure 2:
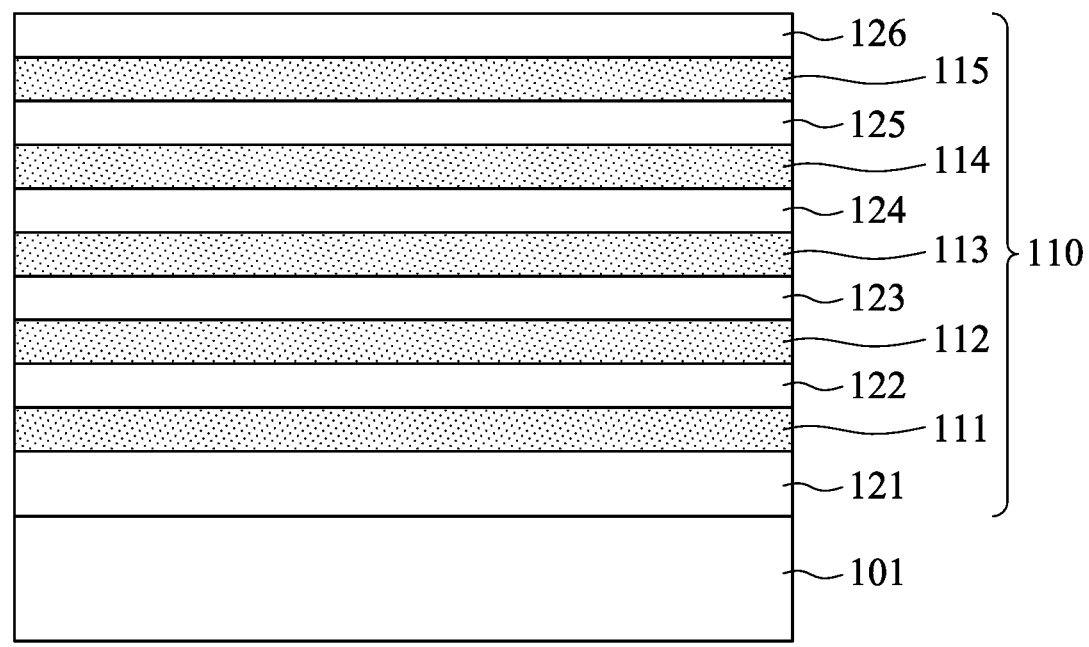
FIGS. 2-17B illustrate a method in various stages of forming a semiconductor device in accordance with some embodiments of the present disclosure.
Figure 2:
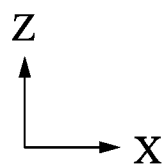

FIGS. 2, 3, 4, 5, 6, 7, 8, 9, 10, 11A, 12, 13, 14, 15, 16A, and 17A illustrate the method M in various stages of forming a memory device 100 in accordance with some embodiments of the present disclosure. In some embodiments, the memory device 100 is a vertical channel flash memory device. The method M begins at block S101. Referring to FIG. 2, in some embodiments of block S101, a multi-layered stack 110 including alternating insulating layers 121-126 and sacrificial layers 111-115 is formed on a semiconductor substrate 101. In some embodiments, the semiconductor substrate 101 may be made of a p-type doped, n-type doped or undoped semiconductor material, such as poly-silicon, germanium (Ge) or any other suitable semiconductor material. In some embodiments, the semiconductor substrate 101 can be a carrier wafer, such as a lower cost wafer or a reclaim wafer, by way of example but not limiting the present disclosure.

The insulating layers 121-126 and the sacrificial layers 111-115 are parallel to each other and alternatively stacked on the semiconductor substrate 101 along Z-direction as shown in FIG. 2. The insulating layer 121 and the insulating layer 126 respectively serve as the bottommost layer and the topmost layer of the multi-layered stack 110, wherein the insulating layer 121 is directly in contact with the semiconductor substrate 101 and electrically isolates the semiconductor substrate 101 from the sacrificial layers 111-115. In some embodiments, the isolation layer 121 may have a thickness substantially greater than that of the insulating layers 121-126. In some embodiments, the thickness of the isolation layer 102 may in a range from about 200 Å (Angstrom) to about 1500 Å, such as 200, 400, 500, 600, 800, 1000, 1200, 1400, or 1500 Å. In some embodiments, the multi-layered stack 110 can be interchangeably referred to a film stack.

In some embodiments, the sacrificial layers 111-115 may be made of silicon-nitride compounds, such as SiN, SiON, silicon carbonitride (SiCN), or the arbitrary combinations thereof. In some embodiments, the topmost sacrificial layer 115 can be interchangeably referred to a source line dummy SiN layer, and the sacrificial layers 111-114 can be interchangeably referred to word line dummy SiN layer. In some embodiments, the insulating layers 121-126 may be made of dielectric material, such as silicon oxide, SiN, SiON, silicate or the arbitrary combinations thereof. In some embodiments, the topmost insulating layer 126 can be interchangeably referred to a hard mask oxide layer. However, it should be appreciated that, in the embodiments of the present invention, the sacrificing layers 111-115 and the insulating layers 121-126 are made of different material. For example, the sacrificial layers 111-115 may be made of silicon nitride, and the insulating layers 121-126 may be made of silicon oxide. In some embodiments, the sacrificial layers 111-115 and the insulating layers 121-126 can be formed by low pressure chemical vapor deposition (LPCVD).

Figure 3:
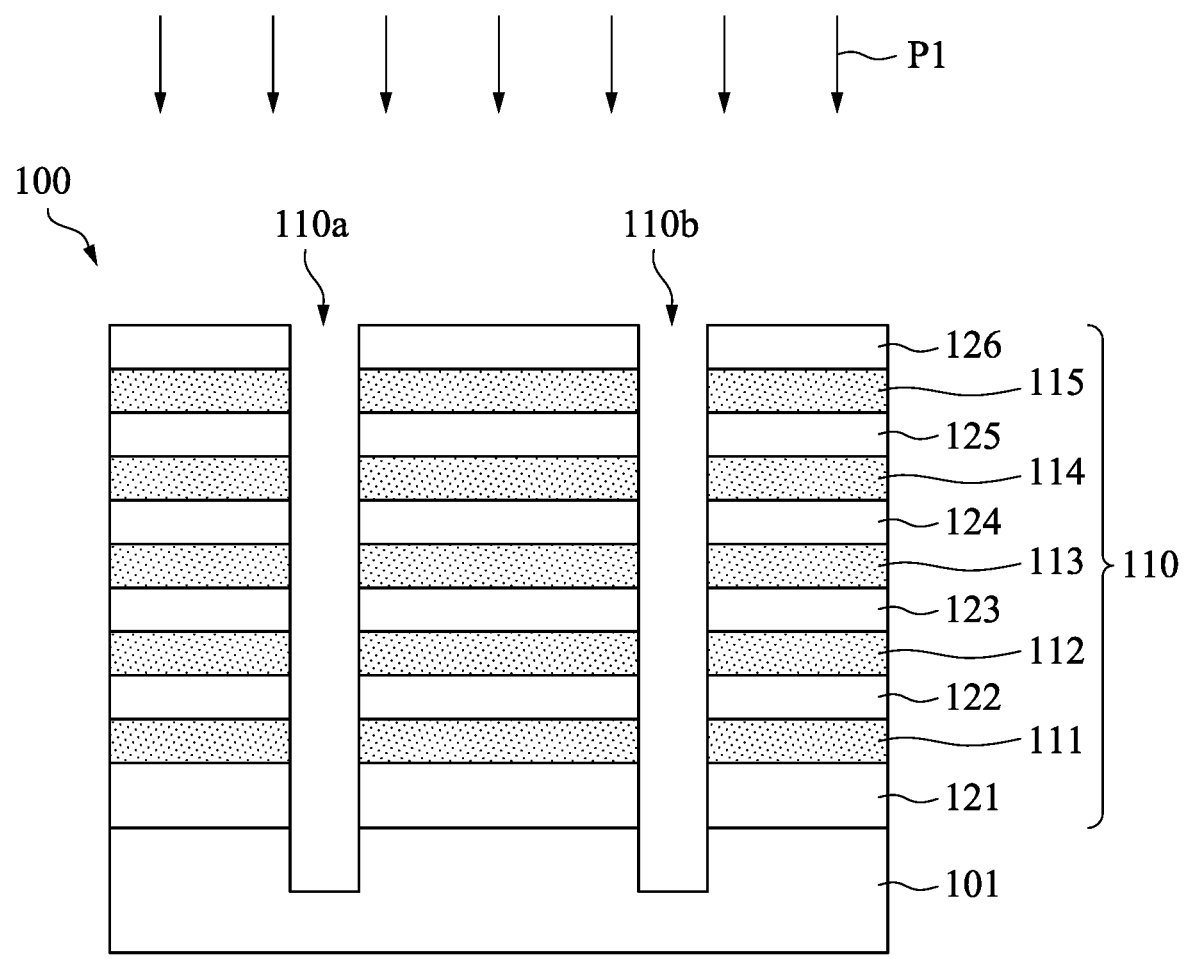

Referring back to FIG. 1A, the method M then proceeds to block S102 where a first etching process is performed to form a first through opening passing through the multi-layered stack and partially in the semiconductor substrate. With reference to FIG. 3, in some embodiments of block S102, an etching process P1, such as a hole etch process, is performed to form a plurality of through openings 110a and 110b passing through the multi-layered stack 110 and partially in the semiconductor substrate 101. In some embodiments, the etching process P1 can be an anisotropic etching process, such as a reactive ion etching (RIE) process, performed on the multi-layered stack 110 using a patterned hard mask layer (not shown) as an etching mask. The through openings 110a and 110b may be a plurality of circular through holes passing through the multi-layered stack 110 along Z-direction and further extending to the semiconductor substrate 101 serving as the bottom of the through openings 110a and 110b. In some embodiments, the through openings 110a and 110b may pass through the multi-layered stack 110 along Z-direction and terminate at a top surface of the semiconductor substrate 101. The through openings 110a and 110b can be used to expose portions of the sacrificial layers 111-115 and the insulating layers 121-126 serving as the sidewalls of the first through openings 110a and 110b.

Figure 4:
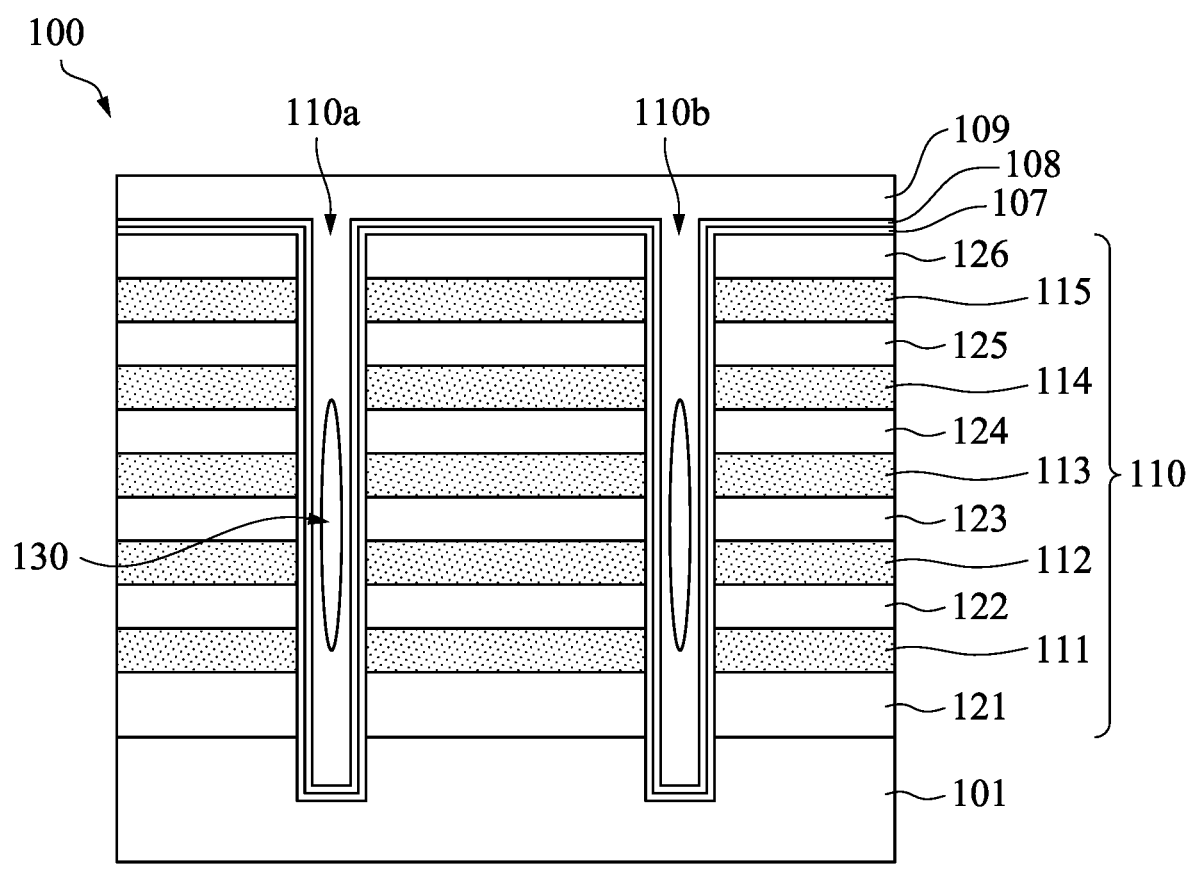

Referring back to FIG. 1A, the method M then proceeds to block S103 where a memory layer is conformally formed over the multi-layered stack and in the first through opening. With reference to FIG. 4, in some embodiments of block S103, a memory layer 107 is formed over the multi-layered stack 110 and on sidewalls and the bottom of the through opening 110a and 110b. In some embodiments, the memory layer 107 may include a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure formed to conformally blanket over the multi-layered stack 110, the sidewalls and the bottoms of the through openings 110a and 110b.

Referring back to FIG. 1A, the method M then proceeds to block S104 where a channel layer is conformally formed over the memory layer. With reference to FIG. 4, in some embodiments of block S104, a channel layer 108 is conformally formed over the memory layer 107. Therefore, the memory layer 107 is disposed between the channel layer 108 and the sacrificial layers 111-115. In some embodiments, the channel layer 108 may be made of semiconductor material, such as such as poly-silicon (Si), Ge or other doped/undoped semiconductor material. For example, the channel layer 108 may be made of undoped poly-silicon.

Referring back to FIG. 1A, the method M then proceeds to block S105 where a first dielectric material is deposited over the channel layer. With reference to FIG. 4, in some embodiments of block S105, a dielectric material 109 is deposited over the channel layer 108 and fills in the through openings 110a and 110b. In some embodiments, the dielectric material 109 may be made of, such as silicon dioxide (SiO$_2$). In some embodiments, at least one air gap 130 may be formed in the filled through openings 110a and 110b. In some embodiments, the dielectric material 109 may be made of a same material as the insulating layers 121-126. In some embodiments, the dielectric material 109 may be made of a different material than the insulating layers 121-126.

Figure 5:
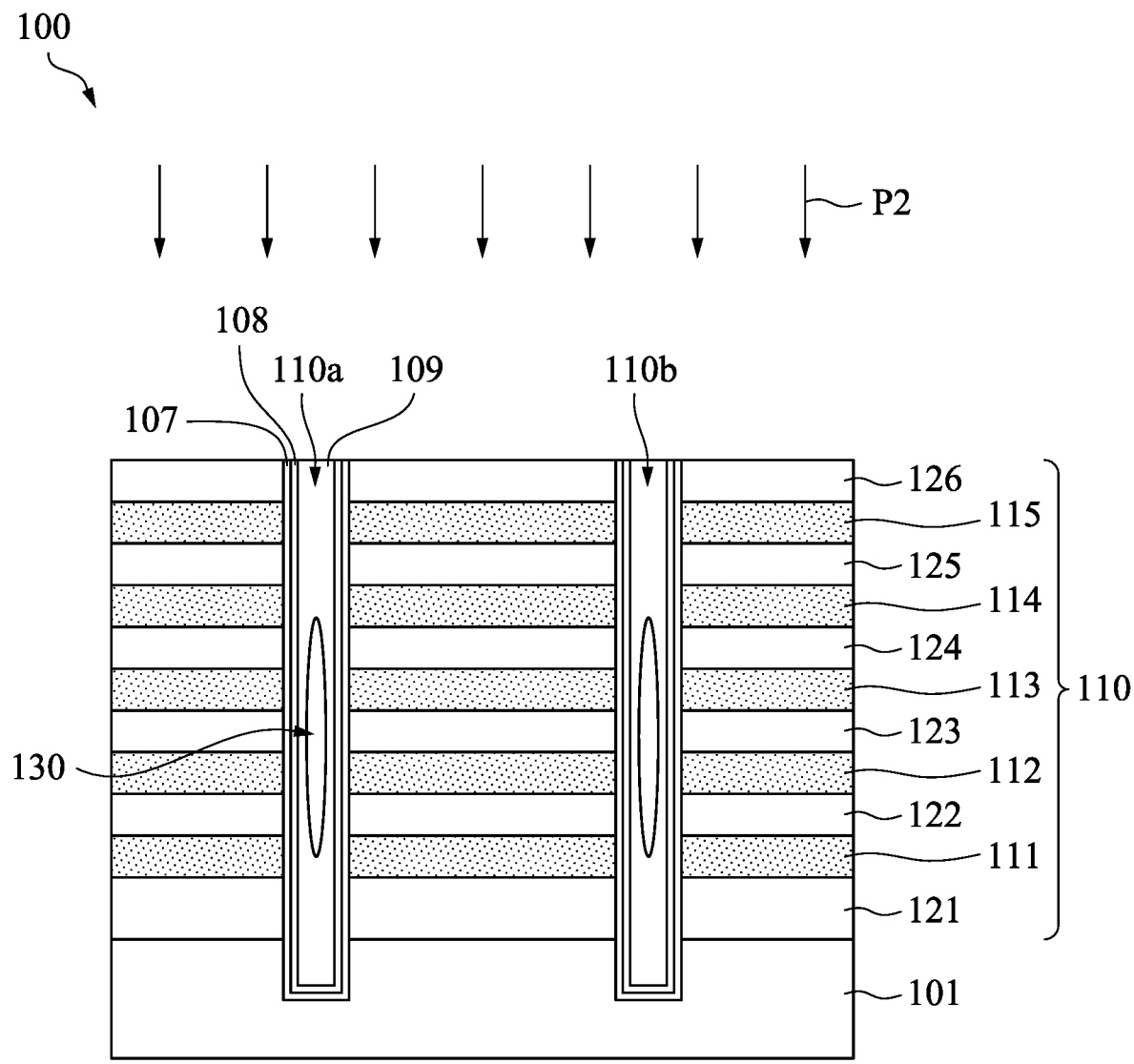

Referring back to FIG. 1A, the method M then proceeds to block S106 where a first planarization process is performed to remove the excessive first dielectric material, channel layer, and memory layer above a top surface of the multi-layered stack. With reference to FIG. 5, in some embodiments of block S106, a planarization process P2 (e.g., CMP) is performed to remove the excessive dielectric material 109, channel layer 108, and memory layer 108 above a top surface of the multi-layered stack 110 (see FIG. 4). As a result of this method, the channel layer 108 wraps around the dielectric material 109 in the through openings 110a and 110b. The memory layer 107 wraps around the channel layer 108 in the through openings 110a and 110b.

Figure 6:
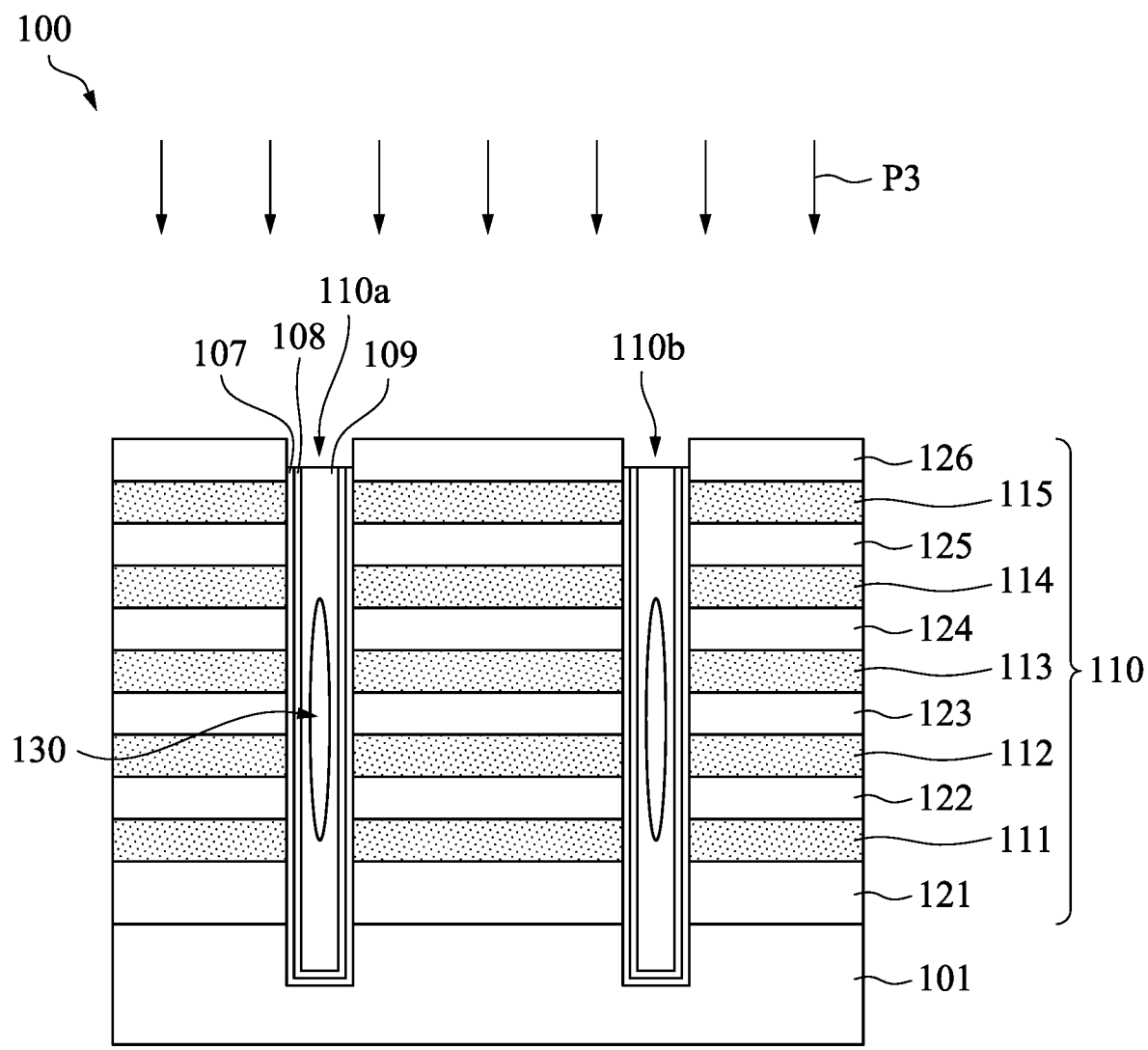

Referring back to FIG. 1A, the method M then proceeds to block S107 where an etching back process is performed on the first dielectric material, the channel layer, and the memory layer to reappear an upper portion of the first through opening. With reference to FIG. 6, in some embodiments of block S107, an etching back process P3 is performed on the dielectric material 109, the channel layer 108, and the memory layer 107 to reappear upper portions of the through openings 110a and 110b. In some embodiments, the etching back process P3 may be a wet etching process, such as that in which the semiconductor substrate 101 is dipped in hydrofluoric acid (HF). In alternative embodiments, the etching back process P3 may be a dry etching process. For example, the dry etching process may be performed using HF/NH3 or NF3/NH3 as the etching gas.

Figure 7:
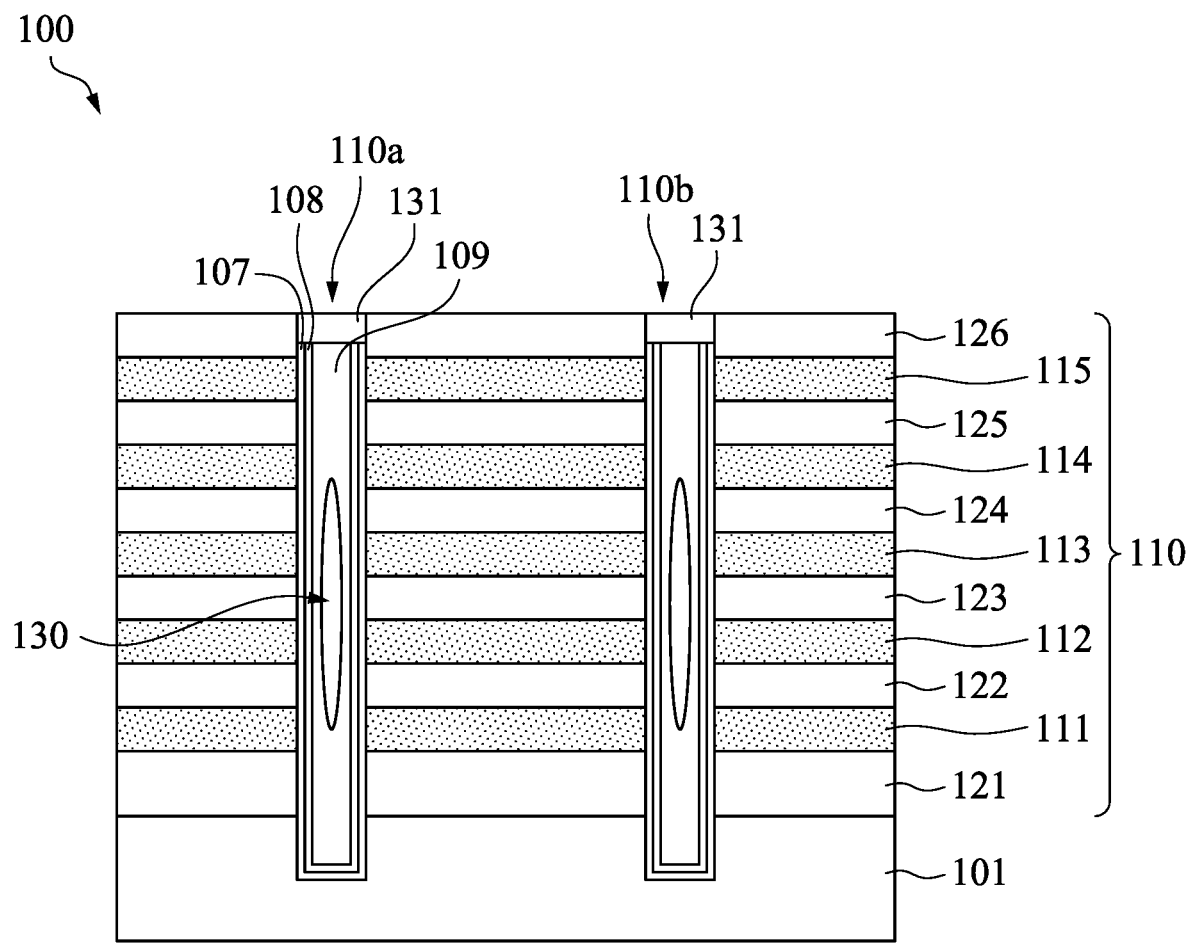

Referring back to FIG. 1A, the method M then proceeds to block S108 where a bond pad is formed in the upper portion of the first through opening. With reference to FIG. 7, in some embodiments of block S108, bond pads 131 are formed in the upper portions of the through openings 110a and 110b and on the dielectric material 109 to form an electrical contact with the channel layer 108. In some embodiments, the bond pads 131 are formed by depositing a poly-silicon (Si), Ge, normally, n-type dopants (N$^+$), such as phosphorus or arsenic over the multi-layered stack 110. Subsequently, a planarization process is performed to remove the excessive semiconductor material above the top surface of the multi-layered stack 110. As a result of this method, the bond pads 131 can be formed as shown in FIG. 7. In some embodiments, the bond pad 131 can be a P$^+$ poly-silicon pad.

Figure 8:
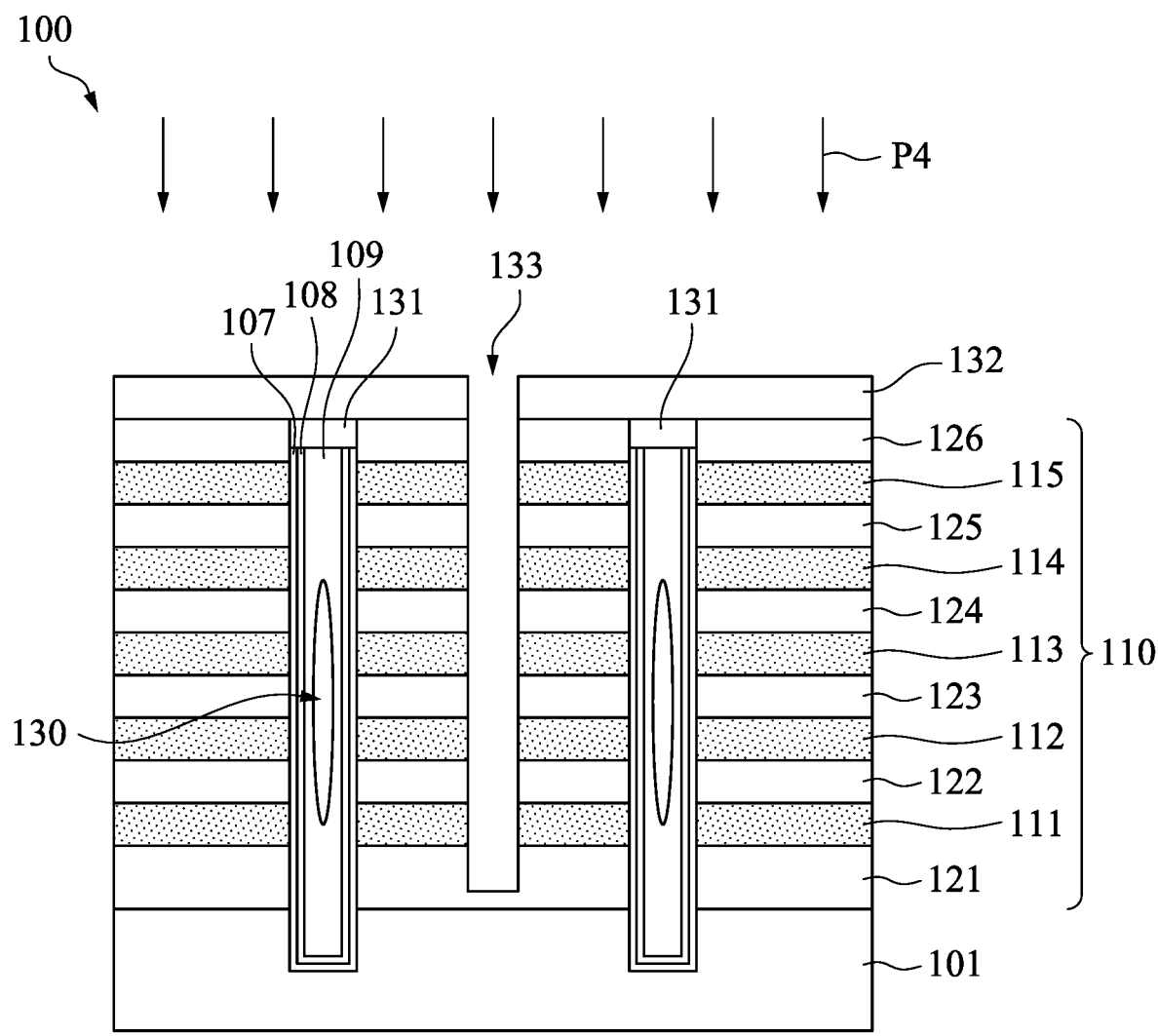

Referring back to FIG. 1A, the method M then proceeds to block S109 where a capping layer is deposited over the bond pad and the multi-layered stack. With reference to FIG. 8, in some embodiments of block S109, a capping layer 132 is deposited over the bond pads 131 and the multi-layered stack 110. The capping layer 132 may be made of dielectric material, such as silicon oxide, silicon nitride (SiN), silicon oxynitride (SiON), silicate or the arbitrary combinations thereof.

Referring back to FIG. 1A, the method M then proceeds to block S110 where a second etching process is performed to form a second through opening passing through the capping layer and the multi-layered stack. With reference to FIG. 8, in some embodiments of block S110, an etching process P4 is performed to form a through opening 133 passing through the capping layer 132 and the multi-layered stack 110 along the Z-direction and terminating prior to reaching the semiconductor substrate 101, so as to partially expose the sacrificing layers 111-115 and the insulating layers 121-126. In some embodiments, the through opening 133 is further formed to expose the semiconductor substrate 101, by way of example but not limiting the present disclosure.

Figure 9:
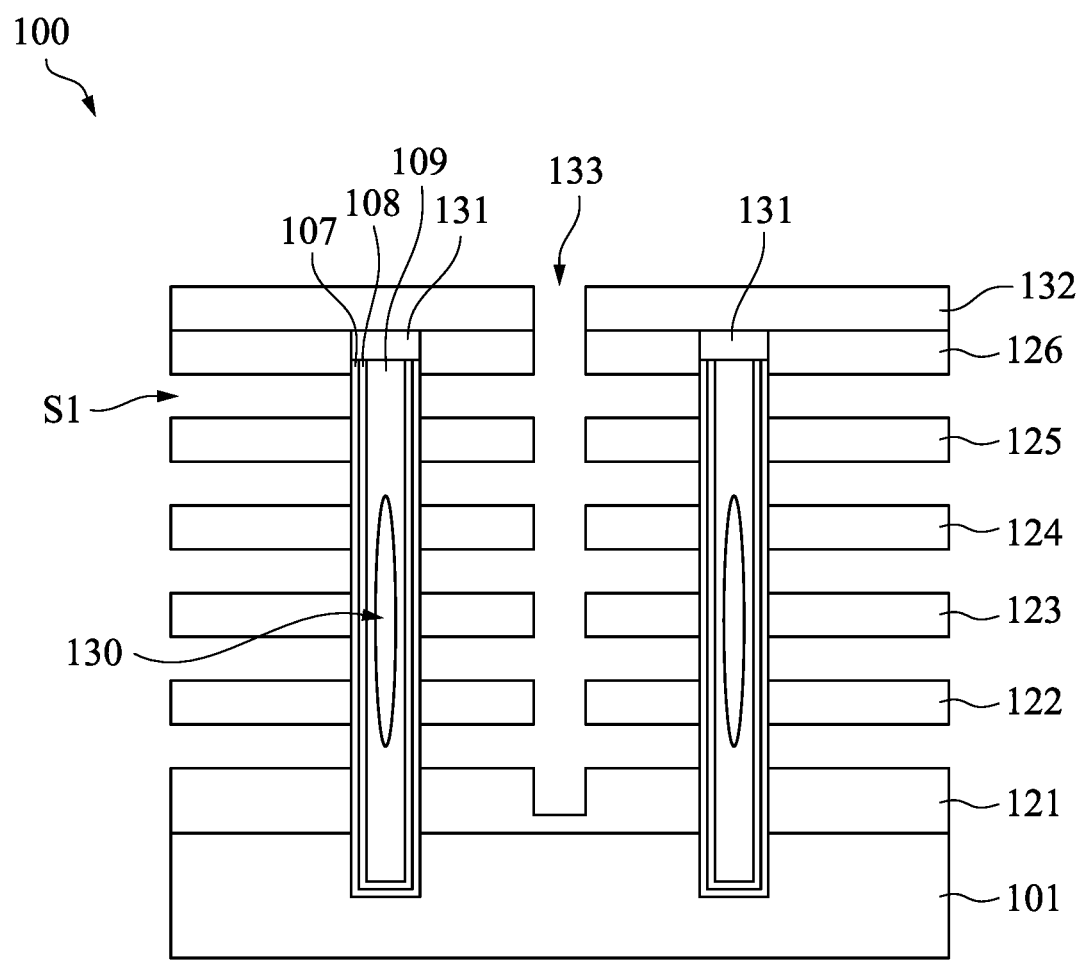

Referring back to FIG. 1B, the method M then proceeds to block S111 where the sacrificial layers are removed through the second through opening. With reference to FIG. 9, in some embodiments of block S111, the sacrificial layers 111-115 are removed, such as using phosphoric acid ($H_3PO_4$) solution, through the through opening 133 to expose portions of the memory layer 107. Therefore, spaces S1 are formed to inherit the shapes of the sacrificial layers 111-115. The capping layer 132 can be made of a material similar to the insulating layers 121-126 and different to the sacrificial layers 111-115. Therefore, the capping layer 132 can have a higher etching selectivity when removing the sacrificial layers 111-115.

Figure 10:
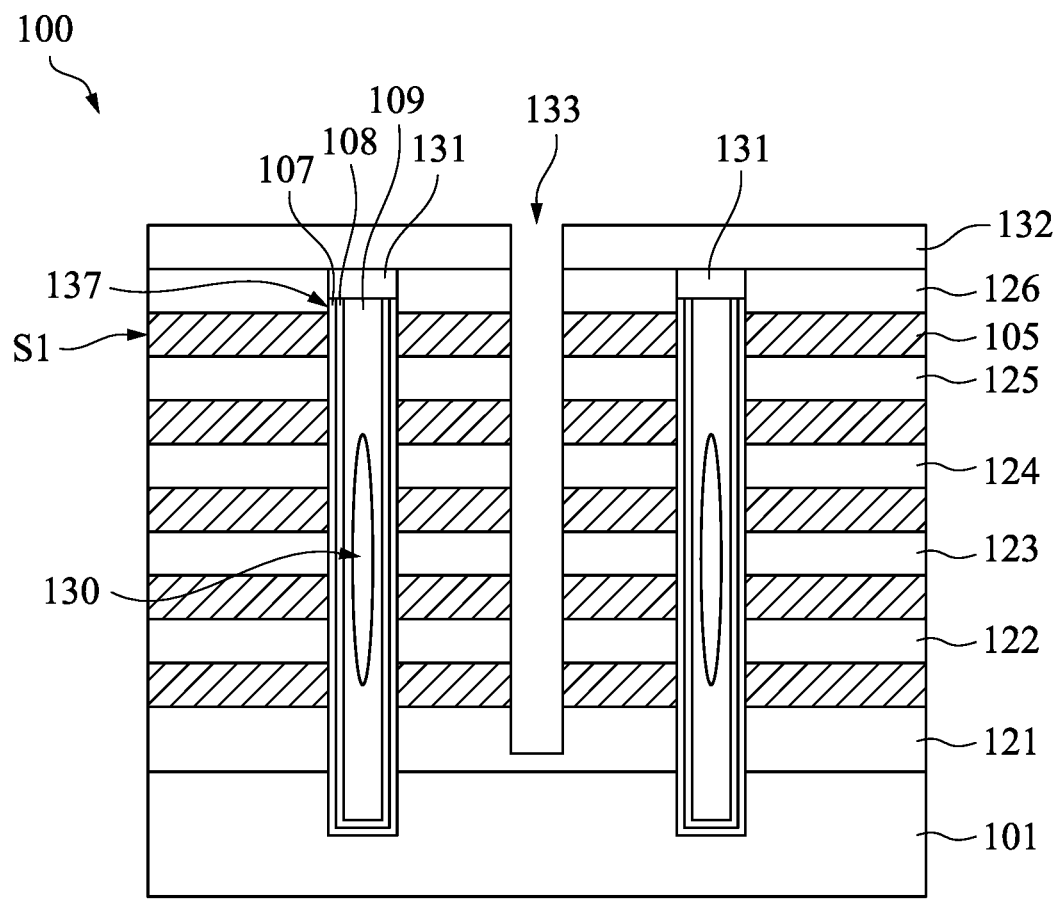

Referring back to FIG. 1A, the method M then proceeds to block S112 where a plurality of first conductive layers are formed in spaces where the sacrificing layers initially occupied to form memory cells. With reference to FIG. 10, in some embodiments of block S112, a plurality of conductive layers 105 are formed in the spaces S1 through the opening 133. As a result, a plurality of memory cells 137 can be defined at the points of intersection between the conductive layers 105, the memory layer 107, and the channel layer 108, so as to form a memory cell array in the multi-layered stack 110. In some embodiments, the memory cells 137 can be interchangeably referred to memory elements. The memory cells 137 are stacked in Z-direction. In some embodiments, the conductive layers 105 may include poly-silicon, metal or other suitable conductive material. In some embodiments, the conductive layers 105 may include metal layers, such as TiN/W, TaN/W, TaN/Cu, or the like. In some embodiments, the conductive layers 105 may include dielectric layer, such as $AlO_x$. For example, each of the conductive layer 105 can be a multi-layered structure including a high-K material layer (e.g., $HfO_x$ layer or $AlO_x$ layer), a TiN layer, and a tungsten layer.

Figure 11A:
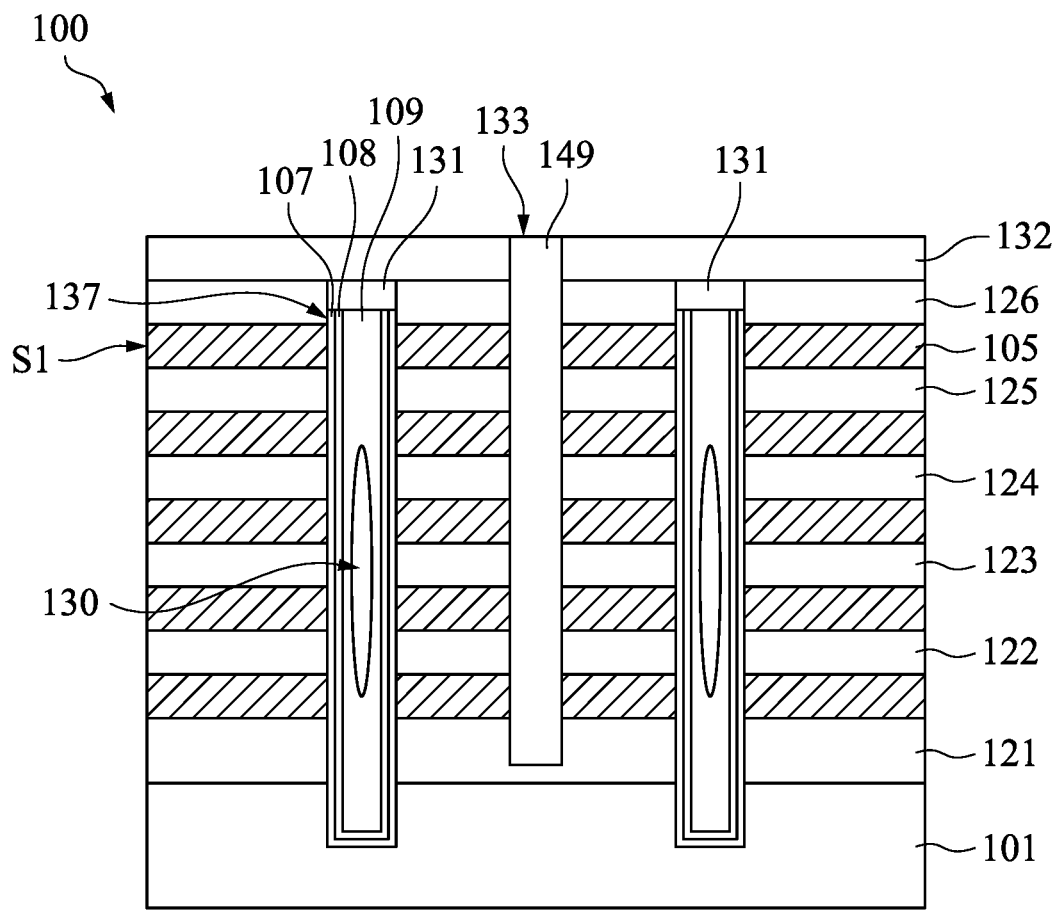

Referring back to FIG. 1B, the method M then proceeds to block S113 where a second dielectric material is formed in the second through opening. With reference to FIG. 11A, in some embodiments of block S113, a dielectric material 149 is deposited over the capping layer 132 and fills in the through opening 133. In some embodiments, the dielectric material 149 may be made of, such as silicon dioxide ($SiO_2$). In some embodiments, the dielectric material 149 may be made of a same material as the insulating layers 121-126. In some embodiments, the dielectric material 149 may be made of a different material than the insulating layers 121-126. Subsequently, a planarization process is performed to remove the excessive dielectric material 149 above a top surface of the capping layer 132.

Figure 11B:
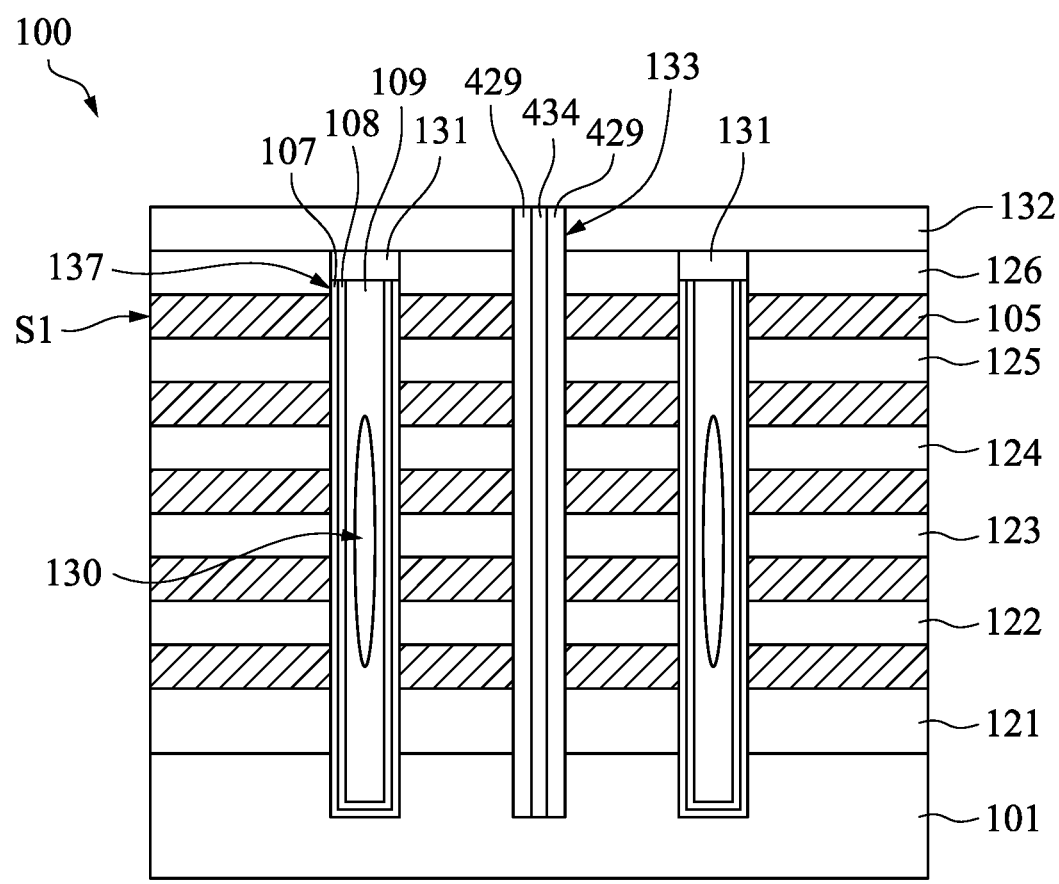
Figure 12:
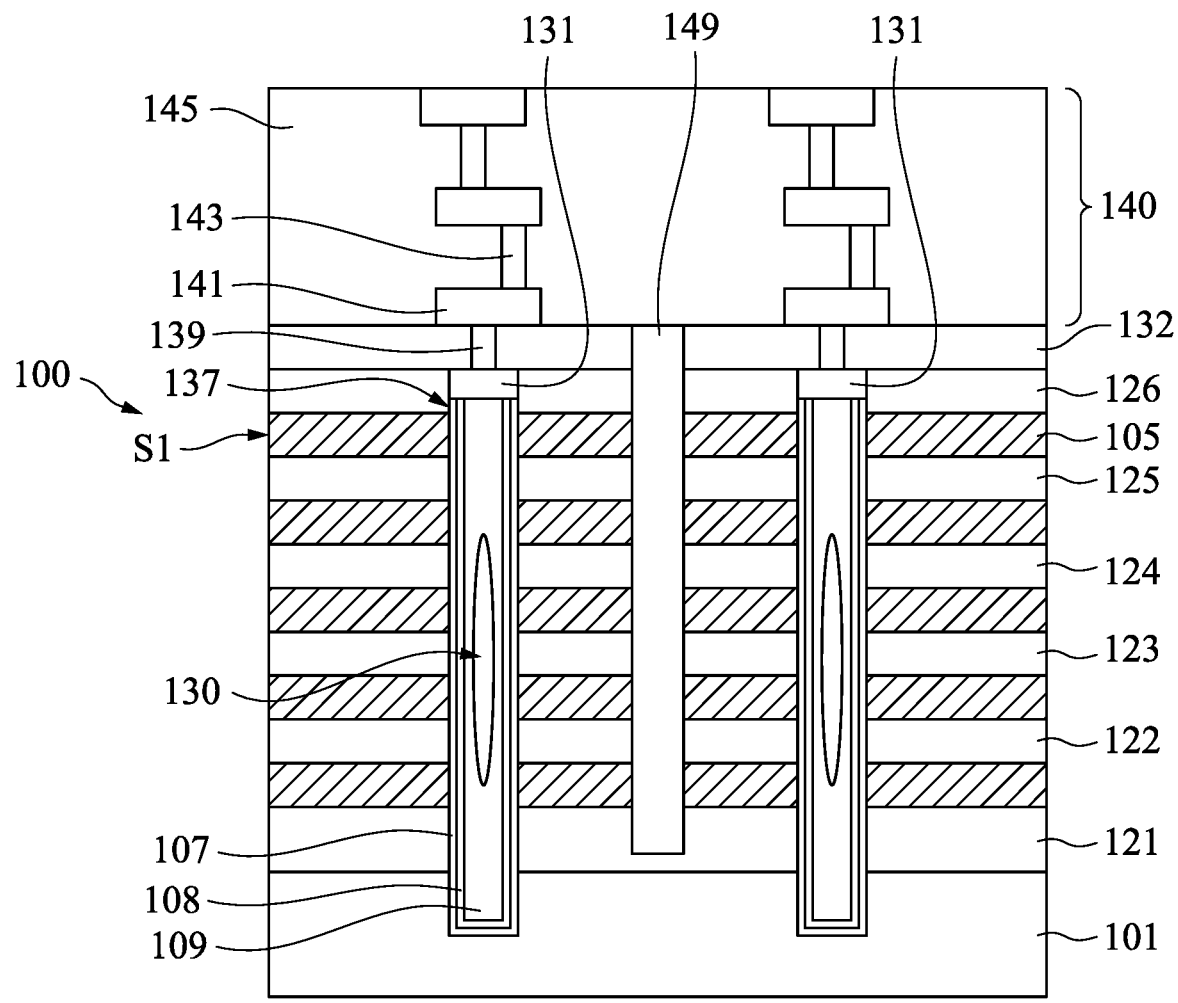

FIG. 11B illustrates another memory device at a stage corresponding to FIG. 11A according to some alternative embodiments of the present disclosure. Material and manufacturing method of elements of the present embodiment are substantially the same as those of the elements as shown in FIG. 11A, and the related detailed descriptions may refer to the foregoing paragraphs, and are not described again herein. The difference between the present embodiment and the embodiment in FIG. 11A is that after the forming of the conductive layers 105, a dielectric spacer 429 may be formed on the sidewalls of the through opening 133. Subsequently, a metal plug 434 may be formed in the dielectric spacer 429. The metal plug 434 can be electrically insulated from the conductive layers 105 by the dielectric spacer 429 and electrically contact to the metallization layers 141 and metallization vias 143 in the interconnect structure 140 which will be subsequently formed as shown in FIG. 12. In some embodiments, the metal plug 434 can be interchangeably referred to a source line. In some embodiments, the metal plug 434 may be made of TiN, TaN, Ti, Ta, Cu, Al, Ag, W, Ir, Ru, Pt, combinations thereof, or other suitable conductive materials. In some embodiments, the dielectric spacer 429 may be made of dielectric material, such as silicon oxide, silicon nitride (SiN), silicon oxynitride (SiON), silicate, combinations thereof, or other suitable dielectric materials.

Referring back to FIG. 1B, the method M then proceeds to block S114 where a conductive via is formed in the capping layer and lands on the bond pad. With reference to FIG. 12, in some embodiments of block S114, conductive vias 139 are formed in the capping layer 132 and land on the bond pads 131. In some embodiments, the conductive vias 139 can be used to provide an electrical connection between the bond pads 131 and an interconnect structure 140 which will be subsequently formed on the conductive vias 139. In some embodiments, the conductive vias 139 may be made of TiN, TaN, Ti, Ta, Cu, Al, Ag, W, Ir, Ru, Pt, combinations thereof, or other suitable conductive materials.

Figure 13:
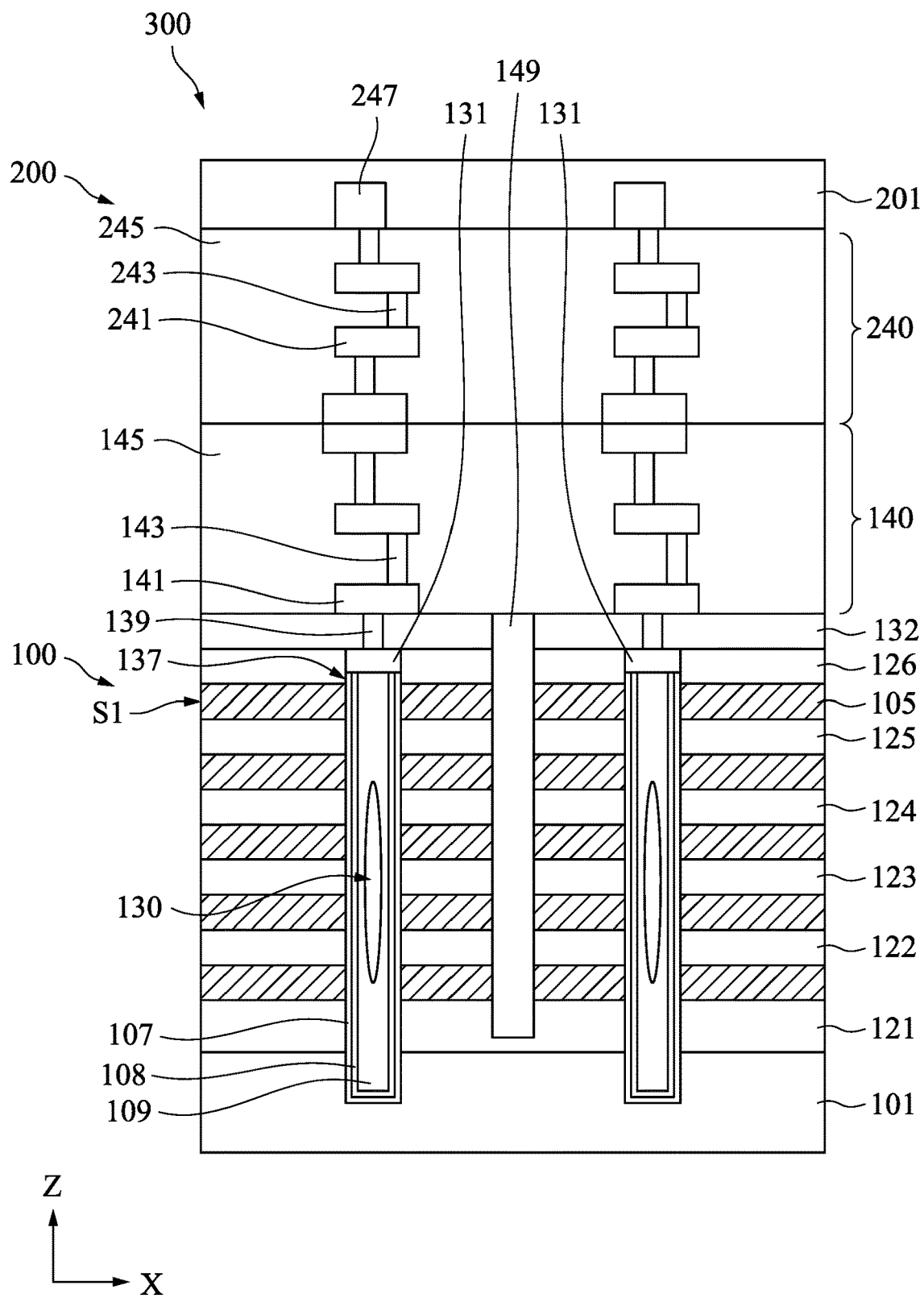

Referring back to FIG. 1B, the method M then proceeds to block S115 where an interconnect structure is formed over the capping layer. With reference to FIG. 12, in some embodiments of block S115, an interconnect structure 140 is formed over the capping layer 132. In some embodiments, the interconnect structure 140 may include, for example, three metallization layers 141, with two layers of metallization vias 143. Other embodiments may contain more or fewer metallization layers and corresponding more or fewer number of vias. In some embodiments, the metallization layers 141 and metallization vias 143 may be made of TiN, TaN, Ti, Ta, Cu, Al, Ag, W, Ir, Ru, Pt, combinations thereof, or other suitable conductive materials. Also included in the interconnect structure 140 is a plurality of inter-metal dielectric (IMD) layers. In some embodiments, the plurality of IMD layers can be collectively referred to as an IMD structure 145. The IMD structure 145 may provide electrical insulation as well as structural support for the various features of the integrated circuit during many fabrication process steps. In some embodiments, the topmost metal layer in the interconnect structure 140 can be interchangeably referred to a bonding layer. For example, the topmost metal layer in the interconnect structure 140 can be a Cu layer for Cu to Cu bonding in a subsequent process as shown in FIG. 13.

Referring back to FIG. 1B, the method M then proceeds to block S116 where an integrated circuit (IC) structure including a semiconductor device is bonded to the interconnect structure to form a stacked substrate structure. With reference to FIG. 13, in some embodiments of block S116, an IC structure 200 is provided. The IC structure 200 includes a semiconductor substrate 201 and an interconnect structure 240 formed on the semiconductor substrate 201. In some embodiments, the semiconductor substrate 201 may include complementary metal-oxide-semiconductor (CMOS) devices 247 therein. The interconnect structure 140 including memory cells 137 (e.g. 3D NAND) can be bonded to the interconnect structure 240 (e.g., CMOS wafer) to electrically connect the CMOS devices 247 in the interconnect structure 240. Therefore, before the bonding, CMOS devices 247 are not impacted by higher thermal budgets of memory process steps for forming the interconnect structure 140. Therefore, the CMOS devices 247 could be advanced process to provide higher speed and lower current operation and to have a smaller area. In some embodiments, the interconnect structure 240 may include, for example, three metallization layers 241, with three layers of metallization vias 243.

Figure 14:
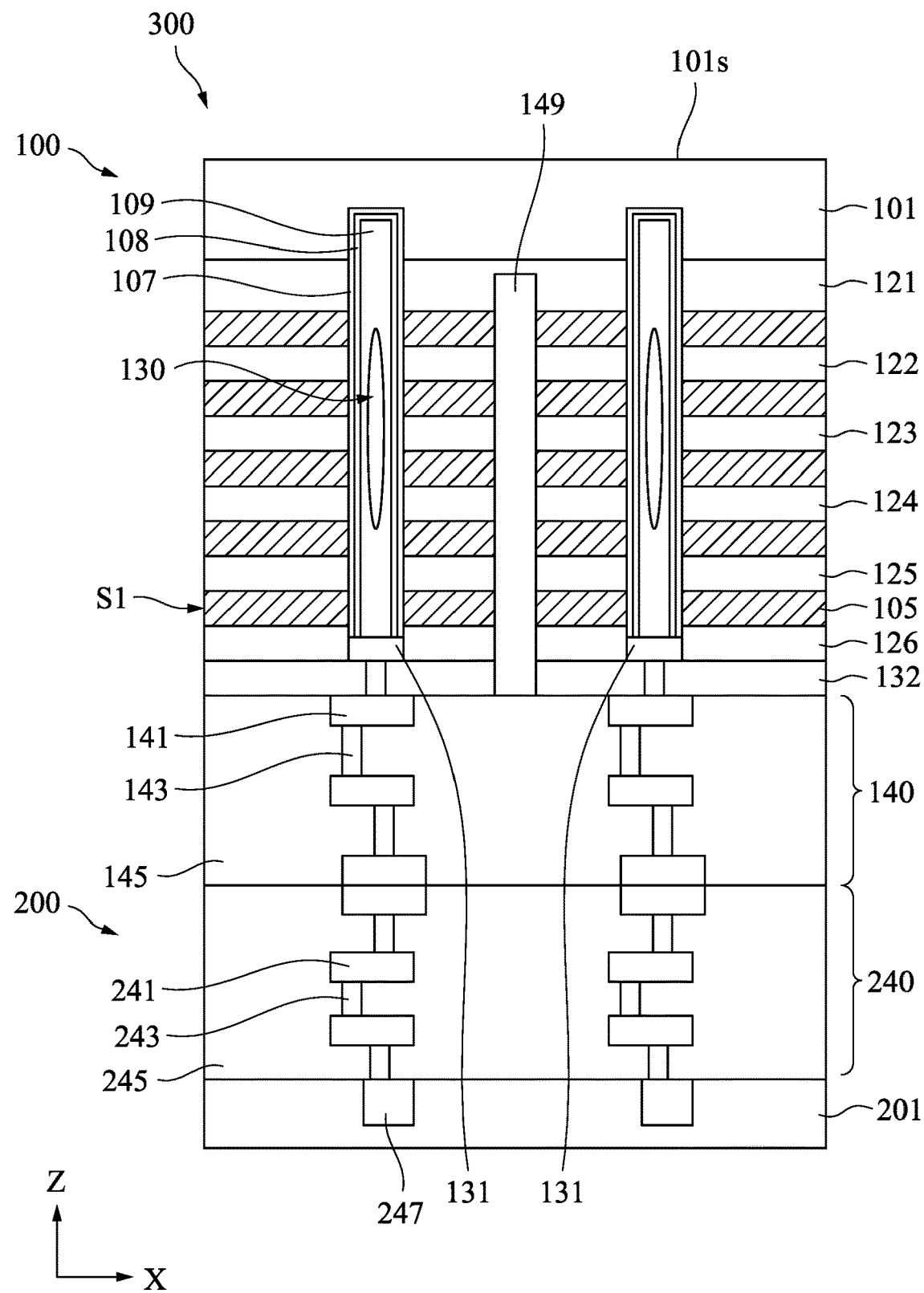

Other embodiments may contain more or fewer metallization layers and corresponding more or fewer number of vias. In some embodiments, the metallization layers 241 and metallization vias 243 may be made of TiN, TaN, Ti, Ta, Cu, Al, Ag, W, Ir, Ru, Pt, combinations thereof, or other suitable conductive materials. Also included in the interconnect structure 240 is a plurality of inter-metal dielectric (IMD) layers. In some embodiments, the plurality of IMD layers can be collectively referred to as an IMD structure 245. The IMD structure 245 may provide electrical insulation as well as structural support for the various features of the integrated circuit during many fabrication process steps. In FIG. 14, the IC structure 200 is bonded to outermost metal layer in the interconnect structure 140 through the outermost metal layer in the interconnect structure 240 to form a stacked substrate structure 300. In some embodiments, the outermost metal layer in the interconnect structure 240 can be interchangeably referred to a bonding layer. In some embodiments, a combination of the interconnect structures 140 and 240 can be referred to as an interconnect stack.

Referring back to FIG. 1B, the method M then proceeds to block S117 where the stacked substrate structure is flipped upside down. With reference to FIG. 14, in some embodiments of block S117, the stacked wafer structure 300 is flipped upside down. After flipping, the surface 101s of the semiconductor substrate 101 faces upwardly and the memory device 100 is carried by the IC structure 200 for subsequent processes. The flipping process may be optional in some embodiments.

Figure 15:
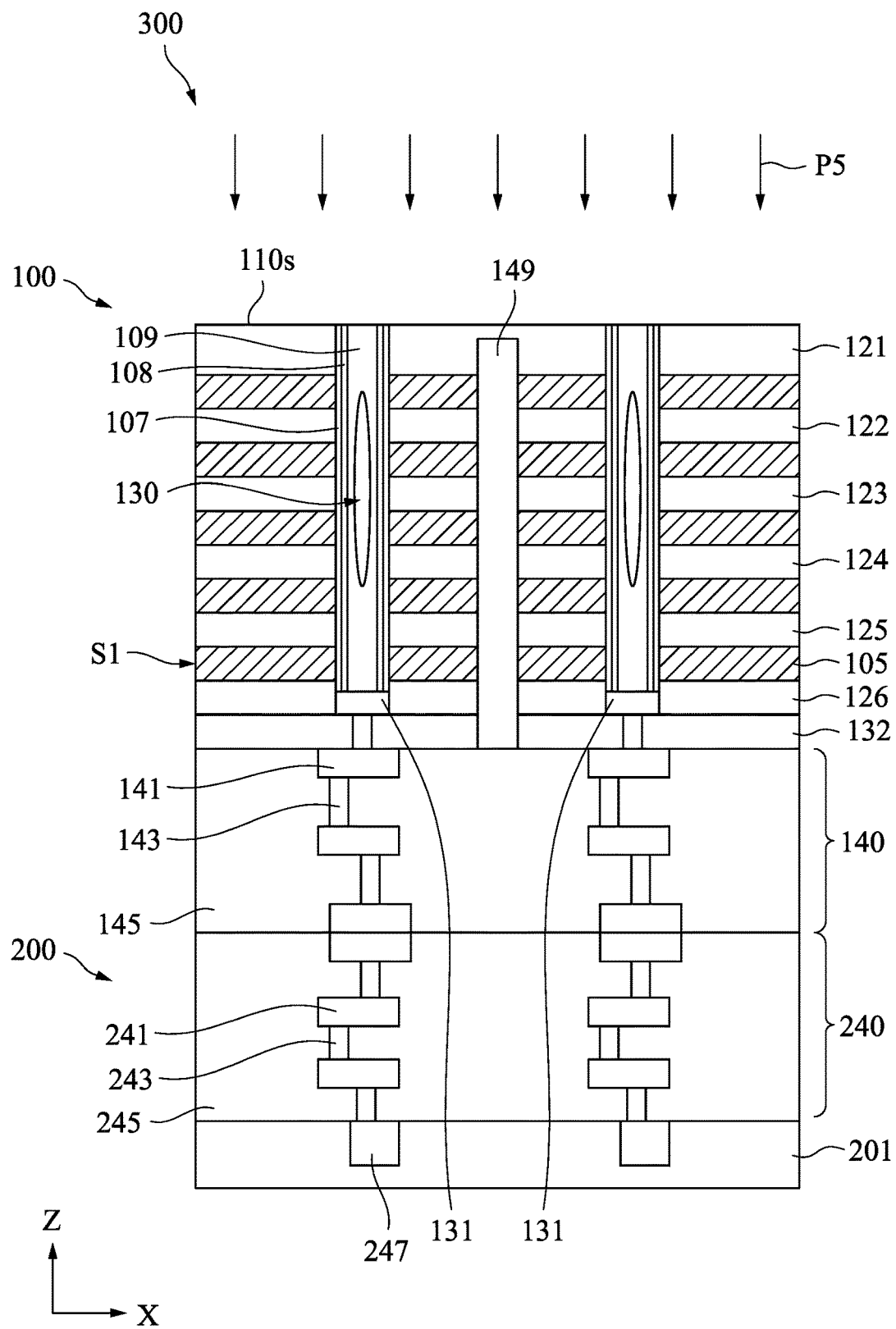

Referring back to FIG. 1B, the method M then proceeds to block S118 where a second planarization process is performed on the semiconductor substrate until the insulating layer is exposed. With reference to FIG. 15, in some embodiments of block S118, a planarization process P5 (e.g., CMP) is performed on the semiconductor substrate 101 and terminates at the insulating layer 121. The planarization process P5 may be used to remove semiconductor substrate 101 (see FIG. 14) from above an outermost surface 101s of the multi-layered stack 110. The resulting structure is illustrated in FIG. 15, and the channel layer 108 is exposed from an outermost surface 110s of the multi-layered stack 110.

Figure 16A:
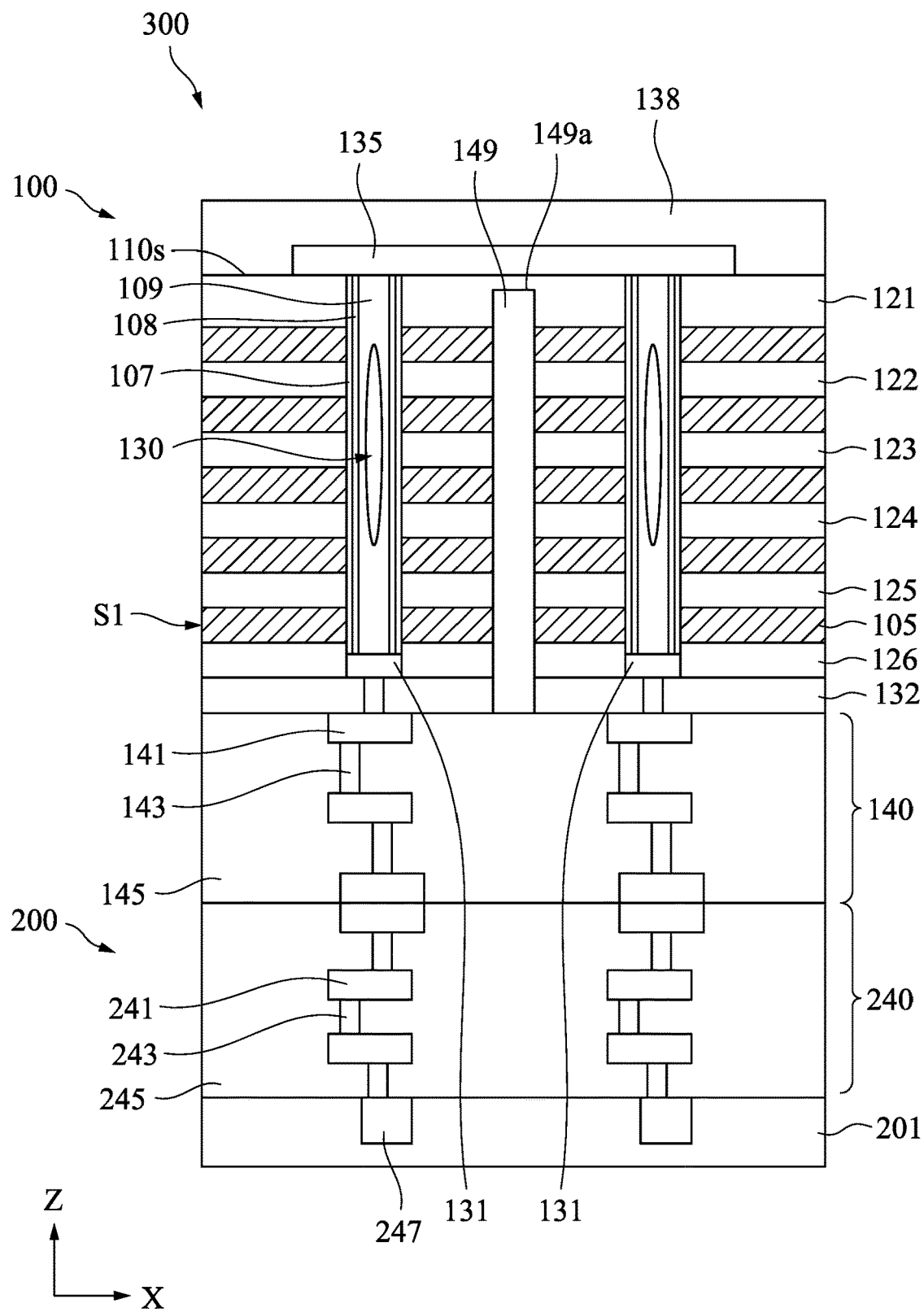

Referring back to FIG. 1B, the method M then proceeds to block S119 where a second conductive layer is formed over the exposed insulating layer and in contact with the channel layer. With reference to FIG. 16A, in some embodiments of block S119, a conductive layer 135 is formed over the exposed insulating layer 121 and in contact with the channel layer 108. The conductive layer 135 can serve as a common source line of the memory device 100. In some embodiments, the conductive layer 135 is formed by depositing a conductive material such as poly-silicon (Si), Ge normally n-type dopants ($N^+$) over the insulating layer 121. Subsequently, a lower temperature anneal process can be performed on the conductive material to activate the dopants in the conductive material. Subsequently, the conductive material is patterned to form the conductive layer 135 as shown in FIG. 16A. In some embodiments, the conductive layer 135 can be to an $N^+$ poly-silicon source line. In FIG. 16A, an isolation layer 138 is further deposited on the conductive layer 135. In some embodiments, the isolation layer 138 may be made of dielectric material, such as silicon oxide, silicon nitride (SiN), silicon oxynitride (SION), silicate, combinations thereof, or other suitable conductive materials. In some embodiments, after the forming of the isolation layer 138, a planarization process (e.g., CMP) may be performed on the isolation layer 138. In some embodiments, the dielectric material 149 may have a longitudinal end 149a in a position vertically between the conductive layer 135 and a topmost one of the conductive layers 105.

Figure 16B:
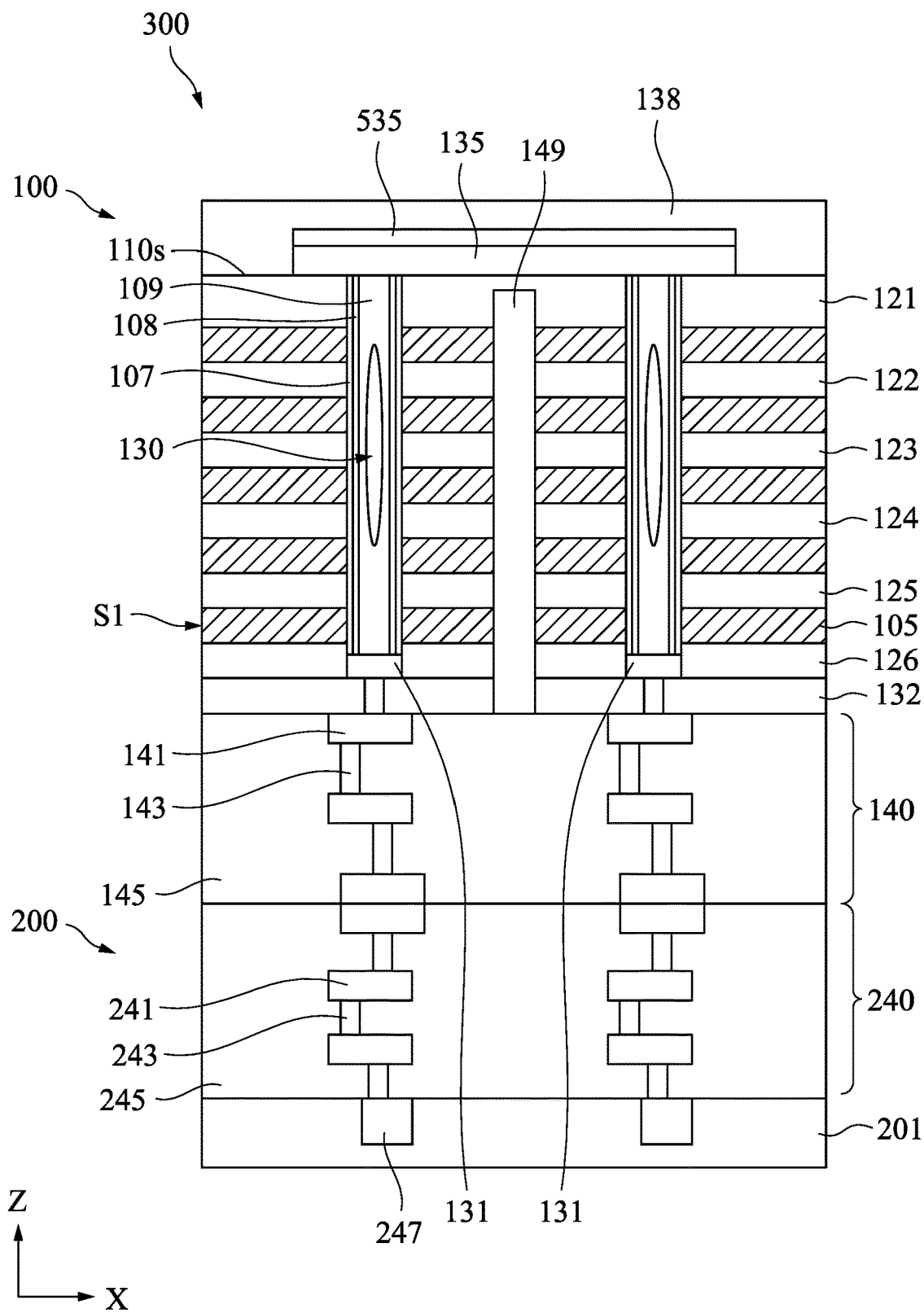

FIG. 16B illustrates another memory device at a stage corresponding to FIG. 16A according to some alternative embodiments of the present disclosure. Material and manufacturing method of elements of the present embodiment are substantially the same as those of the elements as shown in FIG. 16A, and the related detailed descriptions may refer to the foregoing paragraphs, and are not described again herein. The difference between the present embodiment and the embodiment in FIG. 16A is that after the forming of the conductive layer 135, a silicide layer 535 may be formed on the conductive layer 135 to reduce the resistance. In some embodiments, the silicide layer 535 is formed by a metal silicidation process. The metal silicidation process is to make a reaction between metal and silicon (or polycrystalline silicon). Subsequently, regarding the metal silicidation process, a first rapid thermal annealing (RTA) process may be performed in, for example, Ar, He, $N_2$ or other inert atmosphere at a first temperature, such as lower than 200-300'C, to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Subsequently, a second annealing process at a second temperature higher than the first temperature, such as 400-500° C., thereby forming the silicide layer 535 with low resistance. In some embodiments, the silicide layer 535 can be replaced as a metal layer to reduce the resistance with the conductive layer 135.

Figure 17A:
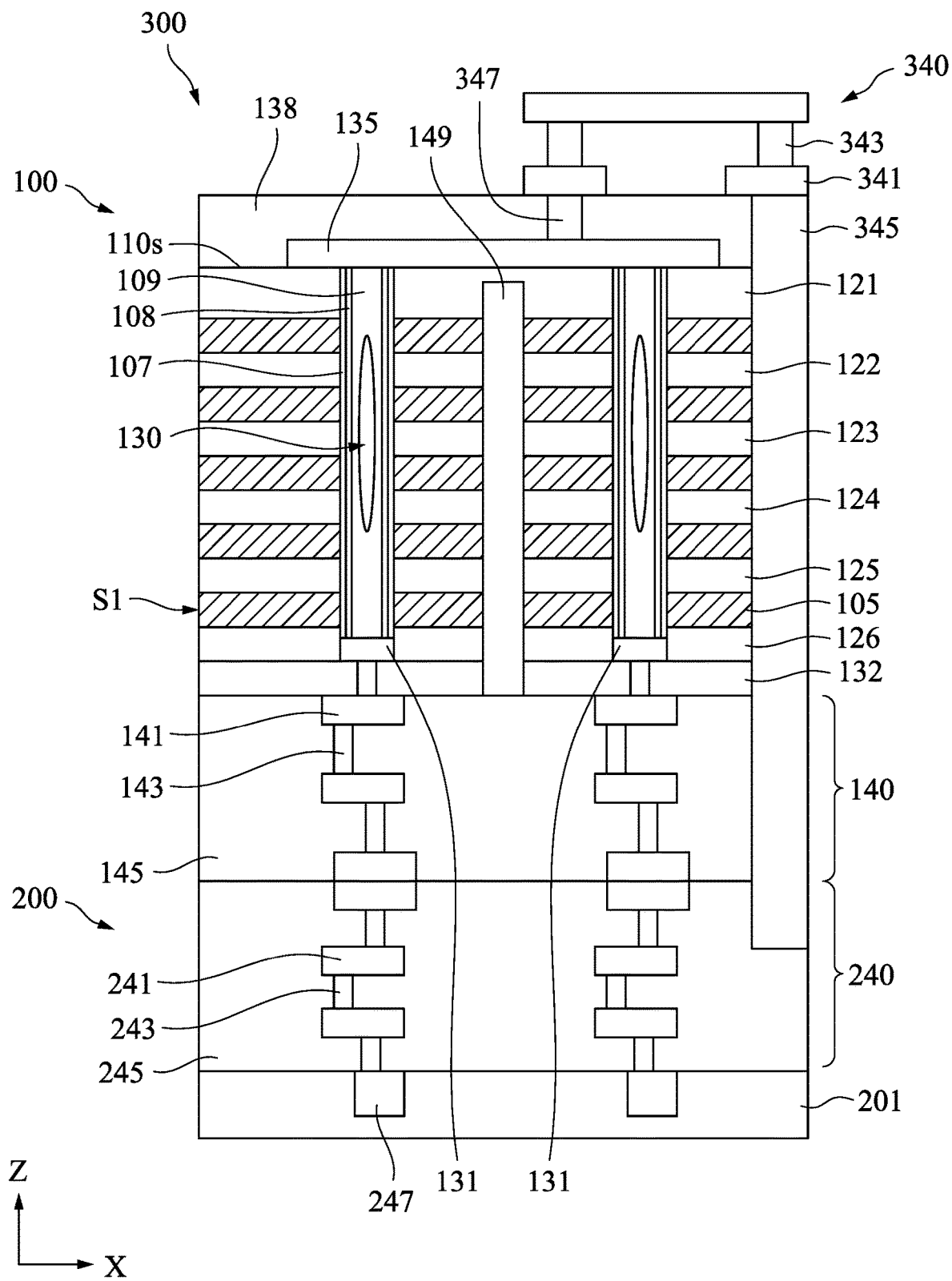

Referring back to FIG. 1B, the method M then proceeds to block S120 where a second interconnect structure is form to connect the second conductive layer connected to the memory cells and the semiconductor device in the bonded integrated circuit structure. With reference to FIG. 17A, in some embodiments of block S120, a interconnect structure 340 is form to connect the conductive layer 135 that is connected to the memory cells 137 and the CMOS devices 247 in the bonded IC structure 200. In some embodiments, the interconnect structure 340 may include metallization layers 341 with vias 343 and 347 and a through silicon via (TSV) 345. The TSV 345 extends form the metallization layers 341 to the level of the metallization layer 241 in the interconnect structure 240 to electrically connect to the CMOS devices 247 in the bonded IC structure 200. In some embodiments, the metallization layers 341, the vias 343 and 347, and the TSV 345 may be made of may include TiN, TaN, Ti, Ta, Cu, Al, Ag, W, Ir, Ru, Pt, combinations thereof, or other suitable conductive materials. In some embodiments, the metallization layers 341 may be formed by a patterning process. In some embodiments, the via 347 in contact with the conductive layer 135 may be an $N^+$ via, by way of example but not limiting the present disclosure.

Figure 17B:
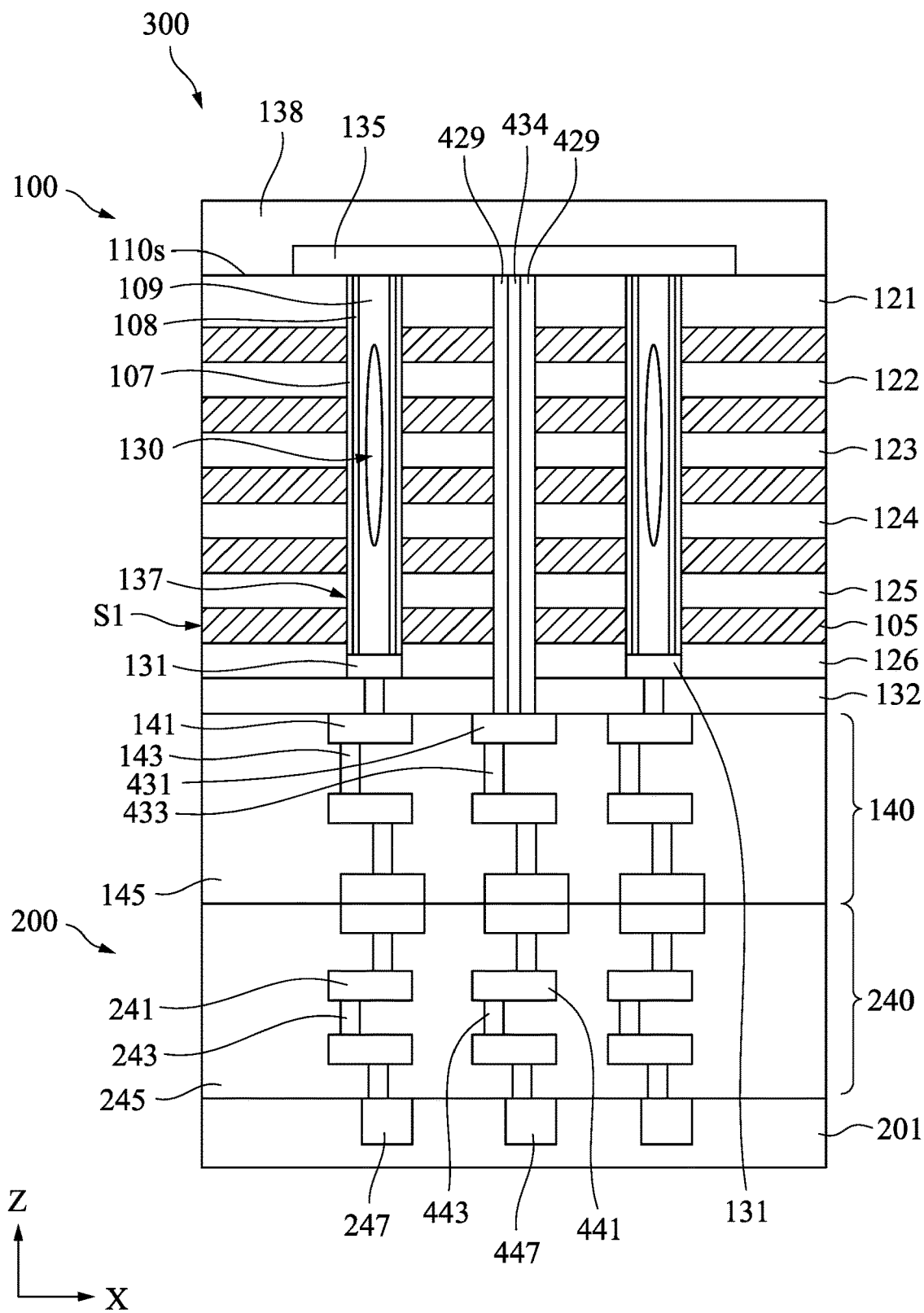

FIG. 17B illustrates another memory device at a stage corresponding to FIG. 17A according to some alternative embodiments of the present disclosure. In some embodiments, material and manufacturing method of elements of the present embodiment are substantially the same as those of the elements as shown in FIG. 17A, and the related detailed descriptions may refer to the foregoing paragraphs, and are not described again herein. The difference between the present embodiment and the embodiment in FIG. 17A is that the conductive layer 135 serving as the common source line of the memory device 100 is electrically connect to the CMOS devices 247 and 447 in the bonded IC structure 200 through the metal plug 434 between the memory cells 137, the metallization layers 431 and metallization vias 433 formed in the interconnect structure 140, and the metallization layers 441 and metallization vias 443 formed in the interconnect structure 240. Specifically, the interconnect structure 140 may include, for example, three metallization layers 431, with two layers of metallization vias 433. The interconnect structure 140 may include, for example, three metallization layers 441, with three layers of metallization vias 443. Other embodiments may contain more or fewer metallization layers and corresponding more or fewer number of vias in the interconnect structure. In some embodiments, the metallization layers 431, 441 and metallization vias 433, 443 each may be made of TiN, TaN, Ti, Ta, Cu, Al, Ag, W, Ir, Ru, Pt, combinations thereof, or other suitable conductive materials.

For next generation semiconductor devices, it is desirable to include memories that can provide high density storage. Therefore, a 3-dimensional (3D) integrated circuit (IC) memory device, such as 3D NAND, can provide high density storage by its multi-layered structure. However, the more layers in 3D NAND are stacked, the harder it is for the source line underneath to form, which may result in low yield.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a 3D NAND having a source line formed thereabove by using a top surface process, which in turn allows the source line to be formed more easily and further improves yield and reduces manufacturing complexity. Moreover, once the source line is formed, the 3D NAND with a carrier wafer can be bonded to a CMOS wafer to electrically connect semiconductor devices in the CMOS wafer. Therefore, before the bonding, the 3D NAND can be formed in a high thermal budget process without impacting the CMOS wafer, which in turn allows for improving the performance of the semiconductor devices in the CMOS wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
   a substrate;
   an interconnect stack over the substrate;
   a first memory array over the interconnect stack and comprising a plurality of first memory elements stacked in a vertical direction each comprising a conductive layer, the first memory array further comprising:
      a memory layer electrically connecting to the conductive layers of the first memory elements and extending downwardly from a topmost one of the conductive layers to a lowermost one of the conductive layers; and
      a channel layer extending along a sidewall of the memory layer;
   a source line in contact with a top end of the channel layer and laterally extending across the first memory array;
   a second memory array over the interconnect stack and comprising a plurality of second memory elements stacked in the vertical direction, the source line further laterally extending across the second memory array; and
   a first dielectric material laterally between the first and second memory arrays and extending through the conductive layers, wherein the first dielectric material is a solid dielectric and is in direct contact with the conductive layers, and when viewed in a cross section, the first dielectric material has a first longitudinal end higher than the topmost one of the conductive layers and a second longitudinal end lower than the lowermost one of the conductive layers and spaced apart from the source line.

2. The IC structure of claim 1, wherein when viewed in the cross section, the first longitudinal end of the first dielectric material is in a position lower than a longitudinal end of the memory layer.

3. The IC structure of claim 1, further comprising a through via downwardly extending past the source line and the first memory array into the interconnect stack to provide an electrically connection between the source line and in the substrate.

4. The IC structure of claim 1, wherein the first memory elements are NAND memory elements.

5. The IC structure of claim 1, wherein the interconnect stack comprises:
   a first interconnect structure over the substrate and comprising a first bonding layer; and
   a second interconnect structure sandwiched between the first interconnect structure and the first memory array and comprising a second bonding layer bonded to the first bonding layer of the first interconnect structure.

6. The IC structure of claim 1, further comprising a metal layer formed on a top surface of the source line.

7. The IC structure of claim 1, wherein when viewed in the cross section, the first longitudinal end of the first dielectric material is in a position lower than a longitudinal end of the channel layer.

8. The IC structure of claim 1, wherein dielectric material is in direct contact with a dielectric layer of the interconnect stack.

9. The IC structure of claim 1, wherein the substrate is a germanium-containing substrate.

10. The IC structure of claim 1, further comprising:
    a second dielectric material extending along a sidewall of the channel layer; and
    an air gap formed in the second dielectric material, wherein the source line is positioned near the topmost one of the conductive layers, while the interconnect stack is located near the lowermost one of the conductive layers, and the topmost one of the conductive layers is closer to the air gap compared to the lowermost one of the conductive layers.

11. A method for forming a memory device, comprising:
    forming a memory array including a plurality of memory elements stacked in a vertical direction on a front side surface of a first substrate, forming the memory array comprises:

forming a multi-layered stack including insulating layers and sacrificial layers alternately stacked in the vertical direction on the front side surface of the first substrate;

etching the multi-layered stack to form a first through opening exposing the first substrate;

forming a memory layer, a channel layer, and a first dielectric material in the first through opening;

etching the multi-layered stack to form a second through opening; and replacing the sacrificial layers with conductive layers through the second through opening to form the memory array;

filling the second through opening with a second dielectric material, wherein the second dielectric material is a solid dielectric and is in direct contact with the conductive layers, and when viewed in a cross section, the second dielectric material has a first longitudinal end higher than a topmost one of the conductive layers and a second longitudinal end lower than a lowermost one of the conductive layers;

forming a first interconnect structure on the memory array;

bonding the first interconnect structure to a second interconnect structure on a second substrate;

performing a planarization process on a back side surface of the first substrate to expose the channel layer in the memory array; and forming a source line on the exposed channel layer, wherein the second dielectric material is spaced apart from the source line.

12. The method of claim 11, wherein the planarization process is performed until an outermost one of insulating layers in the memory array is exposed.

13. The method of claim 11, further comprising:
forming a through via extending from a side of the memory array away from the first substrate to past the first interconnect structure, the through via having a longitudinal end in the second interconnect structure.

14. The method of claim 11, further comprising:
forming a silicide layer on the source line.

15. The method of claim 11, wherein etching the multi-layered stack to form the first through opening comprises further etching the first substrate such that a bottom of the first through opening is in the first substrate.

16. The method of claim 11, wherein the step of etching the multi-layered stack to form the second through opening terminates prior to reaching the first substrate.

17. The method of claim 11, wherein forming the first dielectric material is performed such that an air gap is in the first dielectric material in the first through opening.

18. The method of claim 17, wherein the source line is positioned near the topmost one of the conductive layers, while the first interconnect structure is located near the lowermost one of the conductive layers, and the topmost one of the conductive layers is closer to the air gap compared to the lowermost one of the conductive layers.

19. The method of claim 11, wherein second dielectric material is in direct contact with a dielectric layer of the first interconnect structure.

20. The method of claim 11, wherein the first substrate is a germanium-containing substrate.

* * * * *